United States Patent
Kim et al.

(10) Patent No.: US 10,006,646 B2
(45) Date of Patent: Jun. 26, 2018

(54) OUTDOOR UNIT OF AIR CONDITIONER AND CONTROL DEVICE FOR THE OUTDOOR UNIT

(71) Applicant: Samsung Electronics Co., Ltd., Suwon-si (KR)

(72) Inventors: Kyung Hoon Kim, Suwon-si (KR); Kyo Seung Kim, Seoul (KR); Tae Il Kim, Hwaseong-si (KR); Ji-Ho Baek, Yongin-si (KR); Youn Sang Jang, Cheonan-si (KR); Sun-Muk Choi, Suwon-si (KR); Seung Kwan Choi, Yongin-si (KR); Sung Goo Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 92 days.

(21) Appl. No.: 15/085,143

(22) Filed: Mar. 30, 2016

(65) Prior Publication Data

US 2016/0320077 A1    Nov. 3, 2016

(30) Foreign Application Priority Data

Apr. 30, 2015    (KR) .................. 10-2015-0061390

(51) Int. Cl.
    *F25D 23/12*    (2006.01)
    *F24F 1/24*    (2011.01)
    (Continued)

(52) U.S. Cl.
    CPC .............. *F24F 1/24* (2013.01); *B22C 21/14* (2013.01); *B22D 17/00* (2013.01);
    (Continued)

(58) Field of Classification Search
    CPC .................. F24F 1/24; B22C 21/14
    (Continued)

(56) References Cited

U.S. PATENT DOCUMENTS

5,245,839 A * 9/1993 Chang ............... F25B 45/00
                                                    62/292
2013/0283843 A1* 10/2013 Takenaka ........... F25B 9/006
                                                    62/324.6
(Continued)

FOREIGN PATENT DOCUMENTS

EP    2 844 050 A1    3/2015
JP    2009-0 94088    4/2009
(Continued)

OTHER PUBLICATIONS

Korean Application No. 2019940029595, dated Nov. 8, 1994, 1 page.

(Continued)

*Primary Examiner* — Melvin Jones
(74) *Attorney, Agent, or Firm* — Staas & Halsey LLP

(57) ABSTRACT

An outdoor unit of an air conditioner is provided. The outdoor unit may include a compressor for compressing a refrigerant; a condenser for condensing the refrigerant discharged from the compressor; a control device for containing electronic parts to control the outdoor unit; and a cooling unit in contact with a heat generating part of the electronic parts to cool the heat generating part, wherein the cooling unit comprises a first heat radiation member installed to be in contact with the heat generating part; a refrigerant pipe extending through the first heat radiation member and enabling a refrigerant to flow through the refrigerant pipe; and a second heat radiation member coupled with the first heat radiation member for heat transfer and installed to be in contact with air flowing into the control device.

20 Claims, 17 Drawing Sheets

(51) Int. Cl.
- *F24F 1/30* (2011.01)
- *B22D 17/00* (2006.01)
- *B22D 21/00* (2006.01)
- *B22C 21/14* (2006.01)
- *B22D 19/00* (2006.01)
- *H05K 7/20* (2006.01)
- *F28F 21/08* (2006.01)
- *F28D 21/00* (2006.01)
- *F16K 15/03* (2006.01)
- *F28F 3/12* (2006.01)

(52) U.S. Cl.
CPC ....... *B22D 19/0072* (2013.01); *B22D 21/007* (2013.01); *F24F 1/30* (2013.01); *F28F 21/084* (2013.01); *H05K 7/20918* (2013.01); *H05K 7/20927* (2013.01); *F16K 15/03* (2013.01); *F28D 2021/0029* (2013.01); *F28F 3/12* (2013.01)

(58) Field of Classification Search
USPC .................. 62/259.2, 498, 115, 119
See application file for complete search history.

(56) References Cited

U.S. PATENT DOCUMENTS

| | | | | |
|---|---|---|---|---|
| 2014/0007607 | A1* | 1/2014 | Tamura | F25B 13/00 62/324.6 |
| 2014/0053589 | A1* | 2/2014 | Nishino | F25B 30/00 62/238.1 |
| 2015/0082823 | A1 | 3/2015 | Teraki et al. | |
| 2016/0174411 | A1 | 6/2016 | Lee et al. | |
| 2016/0258636 | A1 | 9/2016 | Kim et al. | |

FOREIGN PATENT DOCUMENTS

| | | |
|---|---|---|
| JP | 2009-106565 | 5/2009 |
| JP | 2009-107605 | 5/2009 |
| JP | 2009-132029 | 6/2009 |
| JP | 2009-132267 | 6/2009 |
| JP | 2009-133613 | 6/2009 |
| JP | 2009-137527 | 6/2009 |
| JP | 2009-138963 | 6/2009 |
| JP | 2009-524151 | 6/2009 |
| JP | 2009-524797 | 7/2009 |
| JP | 2009-184478 | 8/2009 |
| JP | 2009-193244 | 8/2009 |
| JP | 2009-194093 | 8/2009 |
| JP | 2009-194094 | 8/2009 |
| JP | 2009-198050 | 9/2009 |
| JP | 2009-208001 | 9/2009 |
| JP | 2009-216332 | 9/2009 |
| JP | 2009-257748 | 11/2009 |
| JP | 2009-260371 | 11/2009 |
| JP | 2009-264699 | 11/2009 |
| JP | 2009-266491 | 11/2009 |
| JP | 2009-298390 | 12/2009 |
| JP | 2009-299945 | 12/2009 |
| JP | 2010-000964 | 1/2010 |
| JP | 2010-007939 | 1/2010 |
| JP | 2010-12426 | 1/2010 |
| JP | 2010-12427 | 1/2010 |
| JP | 2010-15788 | 1/2010 |
| JP | 2010-32195 | 2/2010 |
| JP | 2010-79881 | 4/2010 |
| JP | 2010-96014 | 4/2010 |
| JP | 2010-107176 | 5/2010 |
| JP | 2010-111269 | 5/2010 |
| JP | 2010-115993 | 5/2010 |
| JP | 2010-116033 | 5/2010 |
| JP | 2010-121604 | 6/2010 |
| JP | 2010-127508 | 6/2010 |
| JP | 2010-148272 | 7/2010 |
| JP | 2010-169055 | 8/2010 |
| JP | 2010-173357 | 8/2010 |
| JP | 2010-243079 | 10/2010 |
| JP | 2010-243080 | 10/2010 |
| JP | 2010-532796 | 10/2010 |
| JP | 2010-255860 | 11/2010 |
| JP | 2010-255862 | 11/2010 |
| JP | 2010-267707 | 11/2010 |
| JP | 2010-281502 | 12/2010 |
| JP | 2011-004874 | 1/2011 |
| JP | 2011-005983 | 1/2011 |
| JP | 2011-31704 | 2/2011 |
| JP | 2011-75140 | 4/2011 |
| JP | 2011-512507 | 4/2011 |
| JP | 2011-112229 | 6/2011 |
| JP | 2011-133969 | 7/2011 |
| JP | 2011-141859 | 7/2011 |
| JP | 2011-143160 | 7/2011 |
| JP | 2011-155301 | 8/2011 |
| JP | 2011-163584 | 8/2011 |
| JP | 2011-163758 | 8/2011 |
| JP | 2011-522996 | 8/2011 |
| JP | 2011-204154 | 10/2011 |
| JP | 2011-216831 | 10/2011 |
| JP | 2011-242017 | 12/2011 |
| JP | 2012-9898 | 1/2012 |
| JP | 2012-47390 | 3/2012 |
| JP | 2012-57885 | 3/2012 |
| JP | 2012-97736 | 5/2012 |
| JP | 2012-101167 | 5/2012 |
| JP | 2012-154611 | 8/2012 |
| JP | 2012-522958 | 9/2012 |
| JP | 2012-207816 | 10/2012 |
| JP | 2012-218680 | 11/2012 |
| JP | 2013-91481 | 5/2013 |
| JP | 2013-96645 | 5/2013 |
| JP | 2013-525742 | 6/2013 |
| JP | 2013-526458 | 6/2013 |
| JP | 2013-130332 | 7/2013 |
| JP | 2013-164031 | 8/2013 |
| JP | 2013-164944 | 8/2013 |
| JP | 2013-175069 | 9/2013 |
| JP | 2013-181666 | 9/2013 |
| JP | 2013-217569 | 10/2013 |
| JP | 2013-226970 | 11/2013 |
| JP | 2013-242102 | 12/2013 |
| JP | 2013-247908 | 12/2013 |
| JP | 2013-257889 | 12/2013 |
| JP | 2013-543458 | 12/2013 |
| JP | 2014-8839 | 1/2014 |
| JP | 2014-53504 | 3/2014 |
| JP | 2014-76781 | 5/2014 |
| JP | 2014-89024 | 5/2014 |
| JP | 2014-105759 | 6/2014 |
| JP | 2014-126315 | 7/2014 |
| JP | 2014-129944 | 7/2014 |
| JP | 2014-173747 | 9/2014 |
| JP | 2014-173748 | 9/2014 |
| JP | 2014-177154 | 9/2014 |
| JP | 2014-190565 | 10/2014 |
| KR | 1985-0004324 | 7/1985 |
| KR | 1990-7002308 | 12/1990 |
| KR | 1994-0015432 | 7/1994 |
| KR | 1994-016658 | 7/1994 |
| KR | 1996-0004978 | 2/1996 |
| KR | 1996-0018424 | 6/1996 |
| KR | 1996-024021 | 7/1996 |
| KR | 1997-0007216 | 2/1997 |
| KR | 1997-0043011 | 7/1997 |
| KR | 1998-065034 | 10/1998 |
| KR | 1998-067387 | 10/1998 |
| KR | 1999-0044175 | 6/1999 |
| KR | 1999-0053371 | 7/1999 |
| KR | 2000-0004843 | 1/2000 |
| KR | 2000-0003899 | 2/2000 |
| KR | 20-0176060 | 3/2000 |
| KR | 2000-0006119 | 4/2000 |
| KR | 2000-0031161 | 6/2000 |
| KR | 2000-0044076 | 7/2000 |
| KR | 2000-0070976 | 11/2000 |

(56) References Cited

FOREIGN PATENT DOCUMENTS

| | | |
|---|---|---|
| KR | 2001-0005043 | 1/2001 |
| KR | 20-0213996 | 2/2001 |
| KR | 20-0214014 | 2/2001 |
| KR | 2001-0007802 | 2/2001 |
| KR | 2001-0007804 | 2/2001 |
| KR | 2001-0070728 | 7/2001 |
| KR | 2002-0005446 | 1/2002 |
| KR | 2002-0027077 | 4/2002 |
| KR | 2002-0029154 | 4/2002 |
| KR | 2002-0059004 | 7/2002 |
| KR | 20-0289198 | 9/2002 |
| KR | 2002-0095884 | 12/2002 |
| KR | 2003-0031540 | 4/2003 |
| KR | 2003-0071568 | 9/2003 |
| KR | 2003-0088106 | 11/2003 |
| KR | 20-0335450 | 12/2003 |
| KR | 20-0339686 | 1/2004 |
| KR | 10-2004-0045797 | 6/2004 |
| KR | 20-0353120 | 6/2004 |
| KR | 10-2004-0093632 | 11/2004 |
| KR | 10-2005-0064555 | 6/2005 |
| KR | 10-2006-0129789 | 12/2006 |
| KR | 10-2006-0135563 | 12/2006 |
| KR | 10-0696718 | 3/2007 |
| KR | 10-2007-0075119 | 7/2007 |
| KR | 10-2007-0090781 | 9/2007 |
| KR | 10-2007-0101849 | 10/2007 |
| KR | 10-0764708 | 10/2007 |
| KR | 10-2007-0116272 | 12/2007 |
| KR | 10-2007-0118221 | 12/2007 |
| KR | 10-2008-0005434 | 1/2008 |
| KR | 10-0827333 | 5/2008 |
| KR | 10-0836021 | 6/2008 |
| KR | 10-0847602 | 7/2008 |
| KR | 20-2008-0003246 | 8/2008 |
| KR | 10-2008-0098936 | 11/2008 |
| KR | 10-0887280 | 3/2009 |
| KR | 10-2009-0034523 | 4/2009 |
| KR | 10-2009-0056370 | 6/2009 |
| KR | 10-2009-0090574 | 8/2009 |
| KR | 10-2010-0030316 | 3/2010 |
| KR | 10-2010-0032866 | 3/2010 |
| KR | 10-2010-0047256 | 5/2010 |
| KR | 10-2010-0067324 | 6/2010 |
| KR | 10-2010-0007702 | 7/2010 |
| KR | 10-2010-0103930 | 9/2010 |
| KR | 10-2010-0114122 | 10/2010 |
| KR | 10-2011-0047348 | 5/2011 |
| KR | 10-2011-0061216 | 6/2011 |
| KR | 10-2011-0081730 | 7/2011 |
| KR | 10-2011-0110428 | 10/2011 |
| KR | 10-1093191 | 12/2011 |
| KR | 10-2012-0007642 | 1/2012 |
| KR | 10-2012-0095883 | 8/2012 |
| KR | 10-2012-0099073 | 9/2012 |
| KR | 10-2012-0139168 | 12/2012 |
| KR | 10-1217792 | 1/2013 |
| KR | 10-2013-0032222 | 4/2013 |
| KR | 10-2013-0032223 | 4/2013 |
| KR | 10-2013-0032224 | 4/2013 |
| KR | 10-2013-0032225 | 4/2013 |
| KR | 10-2013-0032227 | 4/2013 |
| KR | 10-2013-0032228 | 4/2013 |
| KR | 10-2013-0070942 | 6/2013 |
| KR | 10-1273781 | 6/2013 |
| KR | 10-2013-0075634 | 7/2013 |
| KR | 10-2013-0081664 | 7/2013 |
| KR | 10-2013-0084908 | 7/2013 |
| KR | 10-1335982 | 12/2013 |
| KR | 10-2014-0098535 | 8/2014 |
| WO | 98/44304 | 10/1998 |
| WO | 99/62127 | 12/1999 |
| WO | 2006/011251 | 2/2006 |
| WO | 2006/011297 | 2/2006 |
| WO | 2006/112091 | 10/2006 |
| WO | 2007/086418 | 8/2007 |
| WO | 2010/049998 | 5/2010 |
| WO | 2011/048695 | 4/2011 |
| WO | 2012/105032 | 8/2012 |
| WO | 2012/144344 | 10/2012 |
| WO | WO 2015/002493 A1 | 1/2015 |
| WO | WO 2015/053554 A1 | 4/2015 |

OTHER PUBLICATIONS

Korean Application No. 2019880018149, dated Nov. 3, 1988, 1 page.

Extended European Search Report dated Feb. 17, 2017 in corresponding European Application No. 16162963.9.

* cited by examiner

OUTDOOR UNIT OF AIR CONDITIONER AND CONTROL DEVICE FOR THE OUTDOOR UNIT

CROSS-REFERENCE TO RELATED APPLICATIONS

This application claims the priority benefit under 35 U.S.C. § 119(a) of a Korean patent application filed on Apr. 30, 2015 in the Korean Intellectual Property Office and assigned Serial No. 10-2015-0061390, the entire disclosure of which is incorporated hereby incorporated by reference.

BACKGROUND

1. Field

The present disclosure relates to an outdoor unit of an air conditioner and control device for the outdoor unit, which has an improved structure to control temperatures of electronic parts.

2. Description of the Related Art

An air conditioner is a device that uses refrigeration cycles to control temperature, humidity, etc., to be right for human activities and simultaneously, eliminate e.g., dust in the air. The air conditioner includes an evaporator that cools the surrounding air by evaporating a refrigerant, a compressor that compresses the gas refrigerant coming out of the evaporator into a state of high temperature and high pressure, a condenser that condenses the compressed gas refrigerant into a room temperature liquid state, and an expansion valve that decompresses the high pressure liquid refrigerant.

The air conditioner may be classified into split types and integrated types, among which the split type air conditioner includes an indoor unit installed indoors for sucking in room air, forcing the air to exchange heat with a refrigerant, and discharging the heat-exchanged air back into the room, and an outdoor unit for forcing the refrigerant flowing in from the indoor unit to exchange heat with outdoor air and supplying the refrigerant back to the indoor unit to exchange heat with the room air. The outdoor unit is commonly equipped with the compressor and condenser.

Further, a control device including electronic parts to control the outdoor unit is also equipped in the outdoor unit. The electronic parts may produce heat while operating, and the heat influences the performance of the electronic parts. Accordingly, a cooling device is employed in the outdoor unit to maintain the right temperature for the electronic parts while the air conditioner is working.

The cooling device adopts a cooling method that uses outdoor air and/or a cooling method that uses a refrigerant circulating in the air conditioner. However, cooling efficiency of the cooling unit is degraded when the outdoor unit is operating under a high temperature of about 40° C. or more. Specifically, in case of cooling by using outdoor air, the cooling efficiency is lowered as the temperature of the outdoor air rises; in case of cooling by using a refrigerant, the rise of pressure of the refrigerant due to high temperature requires a lower operating frequency of the compressor that circulates the refrigerant, which leads to less circulation of the refrigerant and thus to degradation of the cooling efficiency.

SUMMARY

In an aspect of one or more embodiments, there is provided an outdoor unit of an air conditioner and control device for the outdoor unit, which has an improved structure to enable electronic parts to operate while maintaining right temperatures.

In an aspect of one or more embodiments, there is provided an outdoor unit of an air conditioner and control device for the outdoor unit, which has an improved structure to efficiently cool a heat generating part of the electronic parts.

In an aspect of one or more embodiments, there is provided an outdoor unit of an air conditioner and control device for the outdoor unit, which has an improved structure to simultaneously perform refrigerant-based cooling and air-based cooling to efficiently cool the heat generating part even under high temperatures.

In accordance with an aspect of one or more embodiments, there is provided an outdoor unit of an air conditioner. The outdoor unit includes a compressor to compress a refrigerant; a condenser to condense the refrigerant discharged from the compressor; a control device which includes electronic parts to control the outdoor unit; and a cooling unit in contact with a heat generating part to cool the heat generating part, wherein the cooling unit includes a first heat radiation member installed to be in contact with the heat generating part; a refrigerant pipe which extends through the first heat radiation member and which enables a refrigerant to flow through the refrigerant pipe; and a second heat radiation member coupled with the first heat radiation member for heat transfer and installed to be in contact with outdoor air flowing into the control device.

The control device may further include a case which provides a room for the electronic parts in the control device, and the first heat radiation member may include a body frame arranged on an outer side of the case and coupled with the case; and a contact part arranged on a side of the body frame and bored through the case to be in contact with the heat generating part.

The body frame may have a plurality of sides and the second heat radiation member may be formed on one of the sides of the body frame except for the one side of the body frame on which the contact part is formed.

The refrigerant pipe may extend through the body frame.

The body frame, the refrigerant pipe, and the second heat radiation member may be coated.

The refrigerant pipe may enable the refrigerant flowing out of the condenser to flow through the inside of the refrigerant pipe.

The first heat radiation member may include aluminum or the second heat radiation member may include aluminum.

The outdoor unit may further include an expansion valve to expand the refrigerant condensed by the condenser, wherein the refrigerant pipe may enable the refrigerant flowing out of the expansion valve to flow through the inside of the refrigerant pipe.

The first heat radiation member may be manufactured in a die casting process of injecting a molten metal into a mold with the refrigerant pipe located inside the mold.

In accordance with an aspect of one or more embodiments, there is provided a control device. The control device includes a case; electronic parts arranged inside the case to control an outdoor unit of an air conditioner; and a cooling unit in contact with a heat generating part of the electronic parts to cool the heat generating part which is heated while operating, wherein the cooling unit includes a first heat radiation member installed to be in contact with the heat generating part; a refrigerant pipe which extends through the first heat radiation member and which enables a refrigerant to flow through the refrigerant pipe; and a second heat radiation member which extends from one side of the first heat radiation member to an outer side of the case.

The first heat radiation member may include a body frame arranged on an outer side of the case and coupled with the case; and a contact part arranged on one side of the body frame and bored through the case to be in contact with the heat generating part, and the second heat radiation member may be arranged on the other side of the body frame.

The refrigerant pipe may have an area surrounded by the body frame.

The body frame, the refrigerant pipe, and the second heat radiation member may be coated.

The refrigerant pipe may enable the refrigerant flowing out of a condenser included in the air conditioner to flow through the inside of the refrigerant pipe.

The refrigerant pipe may be formed to enable the refrigerant flowing out of an expansion valve included in the air conditioner to flow through the inside of the refrigerant pipe.

The first heat radiation member may include aluminum or second heat radiation member may include aluminum.

The first heat radiation member may be manufactured in a die casting process of injecting a molten metal into a mold with the refrigerant pipe located inside the mold.

Other aspects, advantages, and salient features of the disclosure will become apparent to those skilled in the art from the following detailed description, which, taken in conjunction with the annexed drawings, discloses exemplary embodiments of the disclosure.

BRIEF DESCRIPTION OF THE DRAWINGS

The above and other aspects of the present disclosure will become more apparent by describing in detail exemplary embodiments thereof with reference to the attached drawings in which.

Throughout the drawings, like reference numerals will be understood to refer to like parts, components, and structures.

DETAILED DESCRIPTION

Figure 1A:
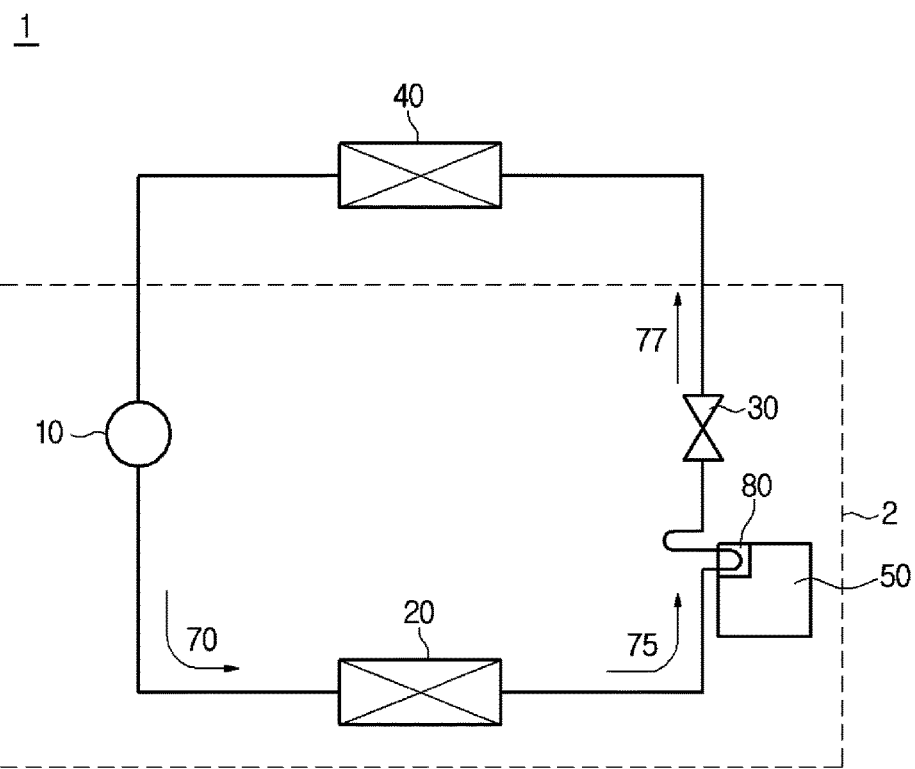
FIG. 1A shows a refrigeration cycle of an air conditioner with a cooling unit, according to an embodiment of the present disclosure.

Reference will now be made in detail to embodiments, examples of which are illustrated in the accompanying drawings, wherein like reference numerals refer to the like elements throughout.

Figure 1B:
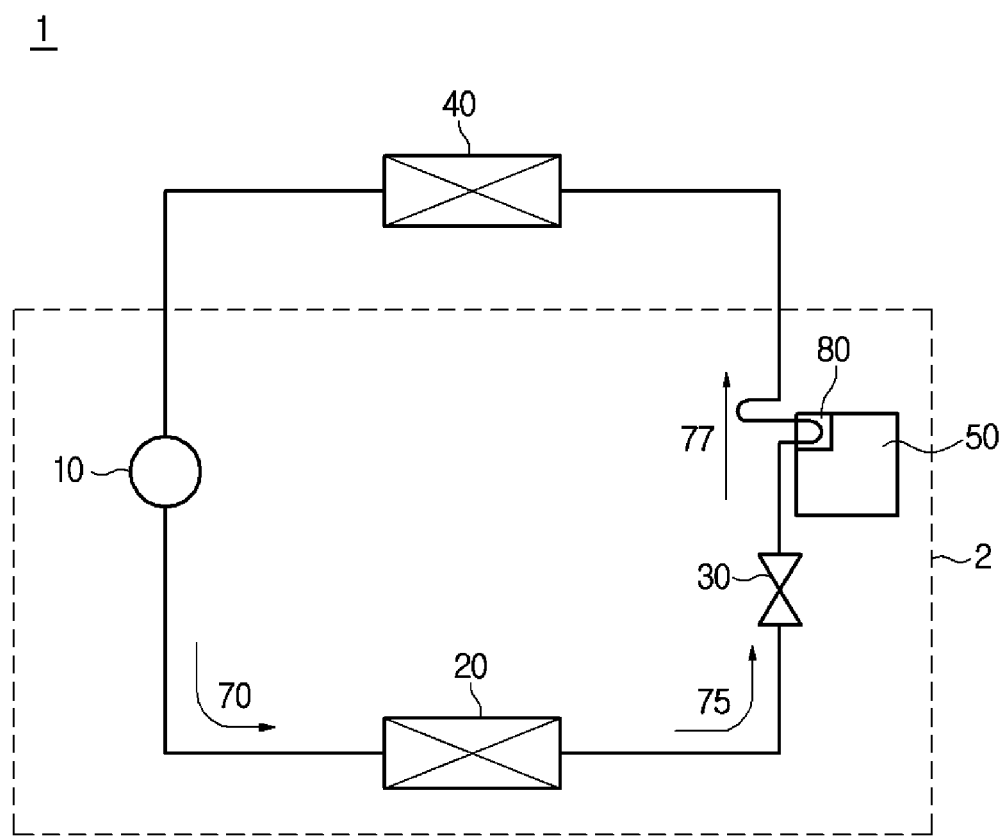
FIG. 1B shows a refrigeration cycle of an air conditioner with the cooling unit of FIG. 1A in a modified position.

FIG. 1A shows a refrigeration cycle of an air conditioner with a cooling unit, according to an embodiment of the present disclosure, and FIG. 1B shows a refrigeration cycle of an air conditioner with the cooling unit of FIG. 1A in a modified position.

Referring to FIG. 1A, a refrigeration cycle of an air conditioner 1 may involve a compressor 10, a condenser 20, an expansion valve 30, and an evaporator 40. The refrigeration cycle circulates a series of processes of compression, condensing, expansion, and evaporation, enabling heat exchange between high temperature air and low temperature refrigerants and thus supplying the cooled air into the room.

The compressor 10 compresses a gas refrigerant 70 into a state of high pressure and high temperature, and discharges the resultant gas refrigerant 70, which flows into the condenser 20. The condenser 20 condenses the compressed gas refrigerant into a liquid, releasing heat to the surroundings. While being condensed by the condenser 20, the refrigerant drops to a low temperature.

The expansion valve 30 expands a high pressure liquid refrigerant 75 condensed by the condenser 20 to a low pressure liquid refrigerant 77. The evaporator 40 evaporates the refrigerant expanded by the expansion valve 30. The evaporator 40 attains cooling effect by exchanging heat with an object to be cooled using latent heat of vaporization of the refrigerant, and forces the low temperature and low pressure gas refrigerant to return to the compressor 10. Conditioned air through this refrigeration cycle may be supplied into the room.

Figure 2:
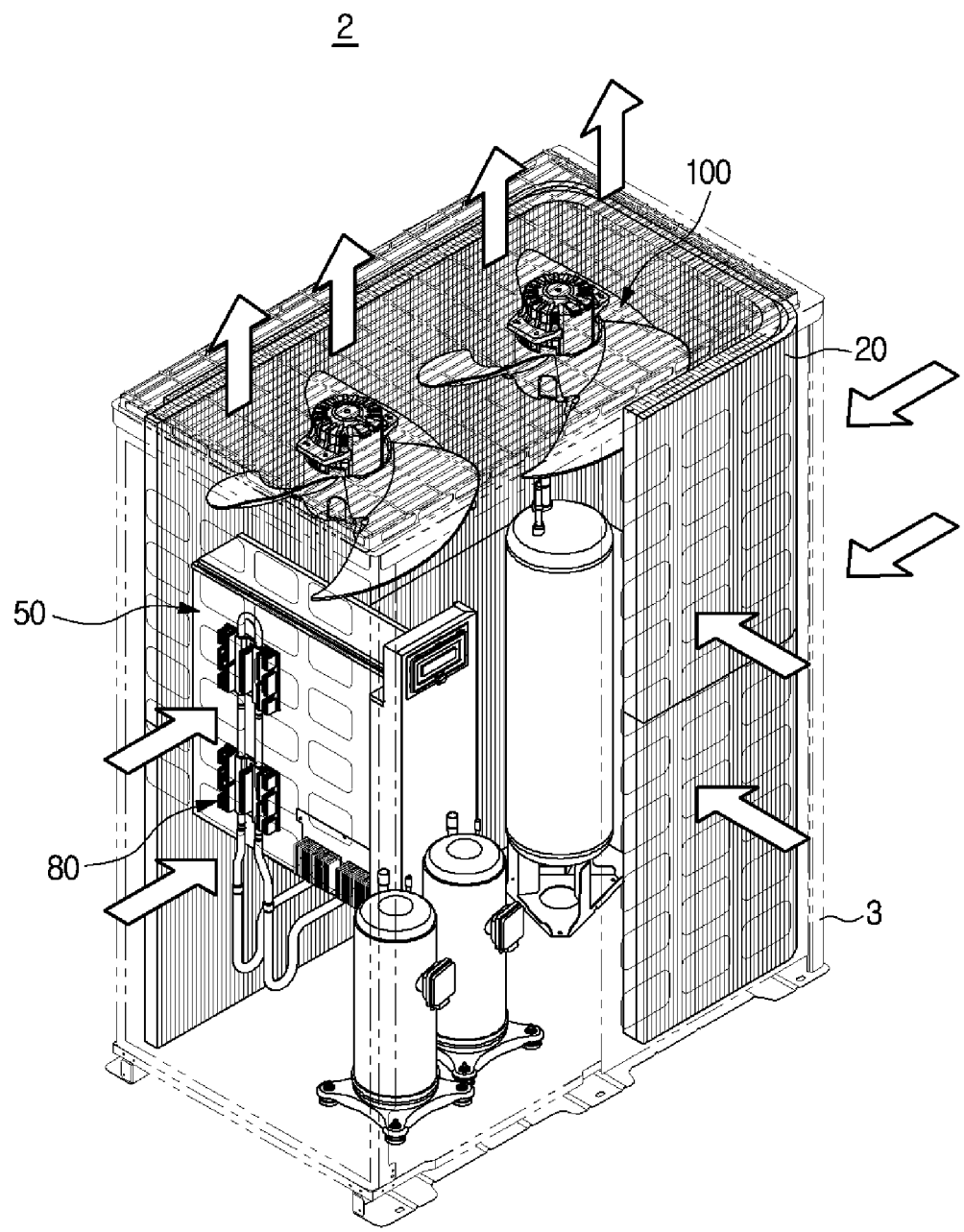
FIG. 2 shows circulation of air in an outdoor unit of an air conditioner, according to an embodiment of the present disclosure.

FIG. 2 shows circulation of air in an outdoor unit of an air conditioner, according to an embodiment of the present disclosure.

Referring FIGS. 1A, 1B, and 2, an outdoor unit 2 of an air conditioner may include the compressor 10 and condenser 20 in the refrigeration cycle. The expansion valve 30 may be located in either an indoor unit (not shown) or the outdoor unit 2, and the evaporator 40 may be located in the indoor unit.

A cooling unit 80 may be installed between the condenser 20 and the expansion valve 30 for the refrigerant 75 that has passed the condenser 20 to flow in thereto. Alternatively, as shown in FIG. 1B, the cooling unit 80 may be installed between the expansion valve 30 and the evaporator 40 for the refrigerant 77 that has passed the expansion valve 30 to flow in thereto.

Referring to FIG. 2, the outdoor unit 2 of an air conditioner may be formed such that outdoor air may flow into some area of an outdoor unit case 3. Accordingly, the condenser 20 located inside the outdoor unit 2 may be formed to exchange heat with the outdoor air flowing into the inside of the outdoor unit 2. The condenser 20 may be arranged in a form that encloses part of the sides of the outdoor unit case 3, to which the outdoor air flows in.

The outdoor unit 2 of an air conditioner may further include a fan 100. The fan 100 may be installed on the top face of the outdoor unit case 3. While the fan 100 is operating, the air inside the outdoor unit 2 may be discharged to the outside through the top face of the outdoor unit case 3, and the outdoor air may flow into the inside of the outdoor unit 2 through the flanking sides of the outdoor unit case 3. The outdoor air flowing into the inside of the outdoor unit 2 may exchange heat with the condenser 20 while passing through the condenser 20.

Figure 3:
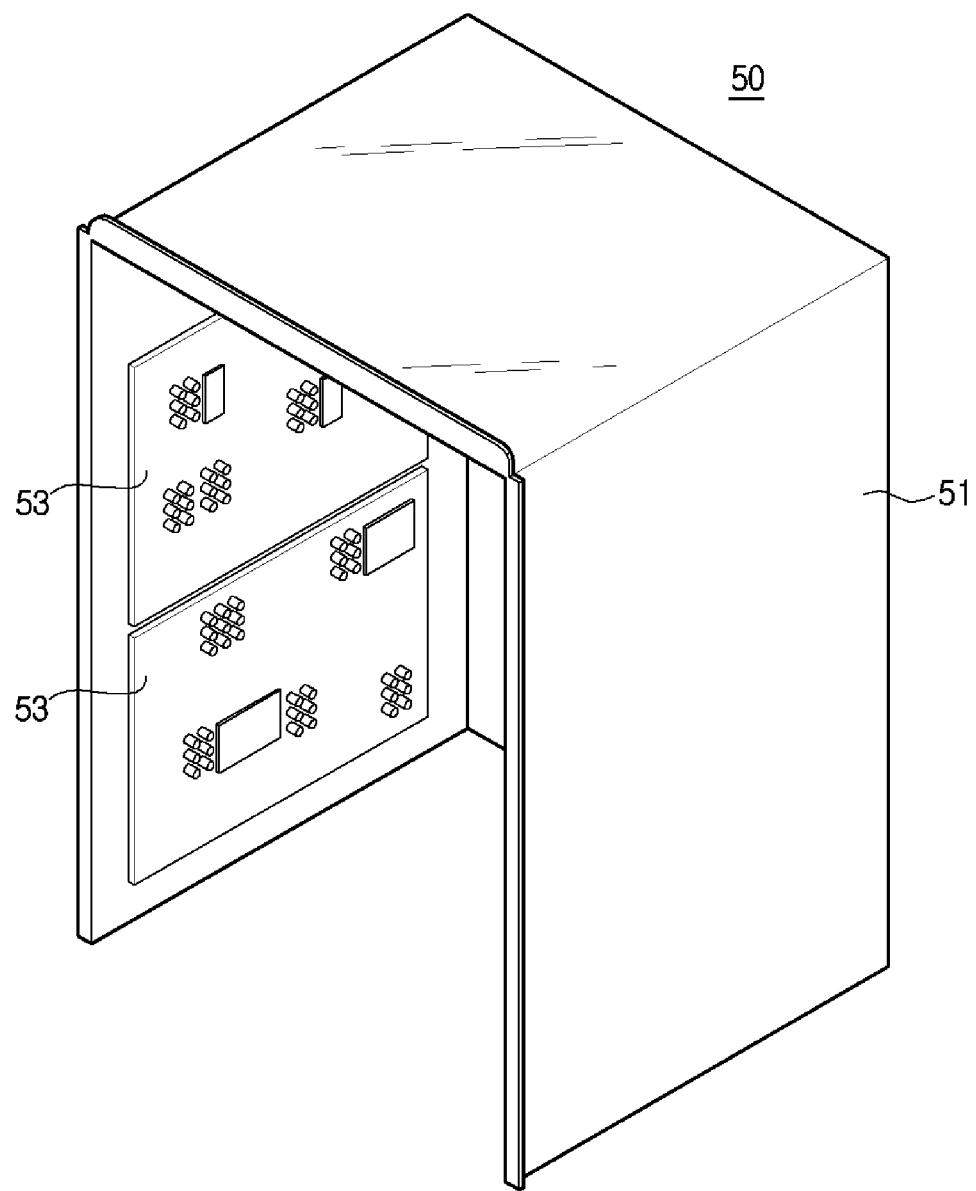
FIG. 3 is a perspective view of a control device, according to an embodiment of the present disclosure.

FIG. 3 is a perspective view of a control device, according to an embodiment of the present disclosure.

Referring to FIGS. 2 and 3, the outdoor unit 2 of an air conditioner may further include a control device 50. The control device 50 may control operation of the outdoor unit 2 of the air conditioner.

The control device 50 may include a case 51 and electronic parts 53.

The case 51 may be located on an inner side of the outdoor unit 2 of the air conditioner. The case 51 may be installed at a position that faces a side of the outdoor unit case 3, to which the outdoor air flows in. The case 51 may isolate the space for the electronic parts 53 in the outdoor unit 2 of the air conditioner.

The electronic parts 53 may be mounted inside the case 51. For example, the electronic parts 53 may be mounted on an inner wall of the case 51.

The electronic parts 53 may be provided on a circuit-mounted print circuit board (PCB). The electronic parts 53 may include an inverter controller, EMI, reactor, etc. The inverter controller may control the compressor 10 to be driven at high speed or low speed, according to conditions of the room where the air conditioner 1 is installed, or according to manipulation of the user.

The electronic parts 53 may be heated while operating. With recent developments in technology, the electronic parts 53 play more roles. Accordingly, the electronic parts 53 consume more power, thereby producing more heat.

The electronic parts 53 may be disabled or may malfunction due to the heat. Furthermore, the temperature rise due to the heat produced in the electronic parts 53 may shorten life spans and cause degradation of the performance of the electronic parts 53. To prevent this, the cooling unit 80 may be installed to cool the electronic parts 53.

An embodiment of the cooling unit 80 in accordance with the present disclosure will now be described in detail.

Figure 4:
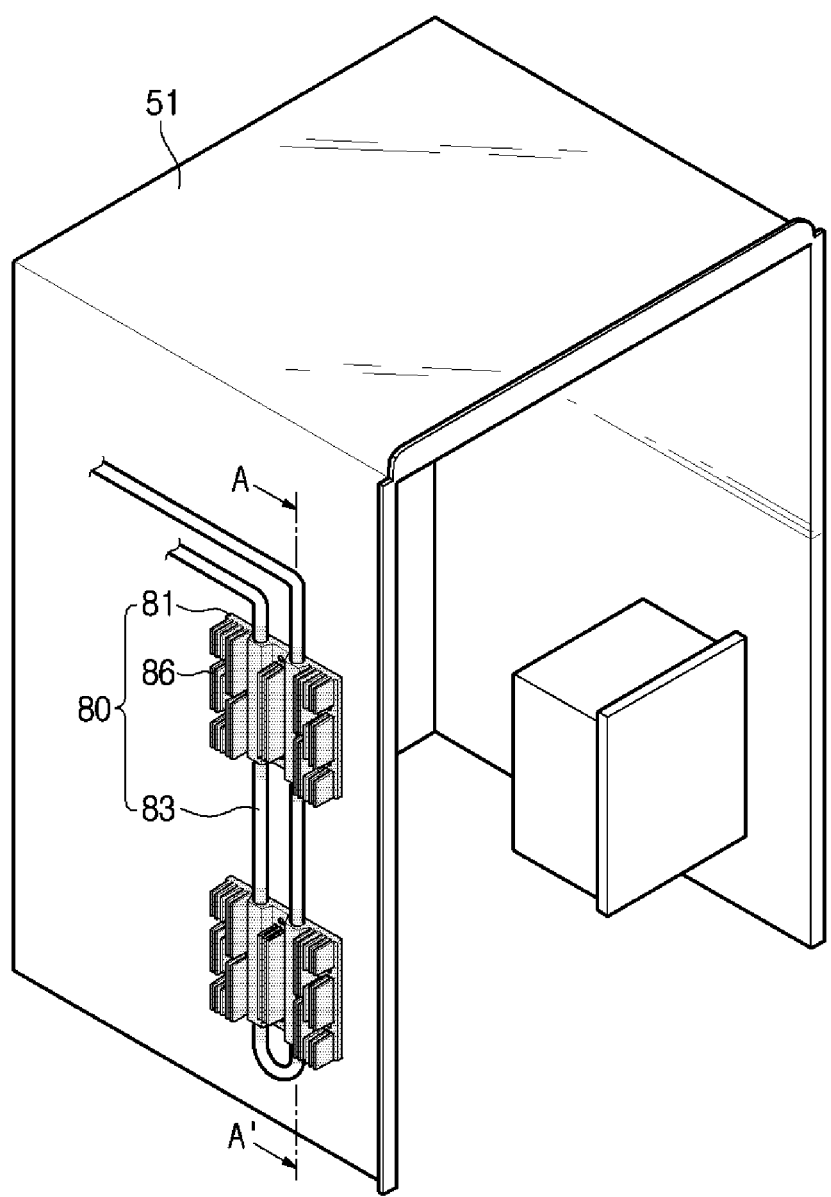
FIG. 4 is a perspective view of a control device with a cooling unit installed thereon, according to another embodiment of the present disclosure.
Figure 5:
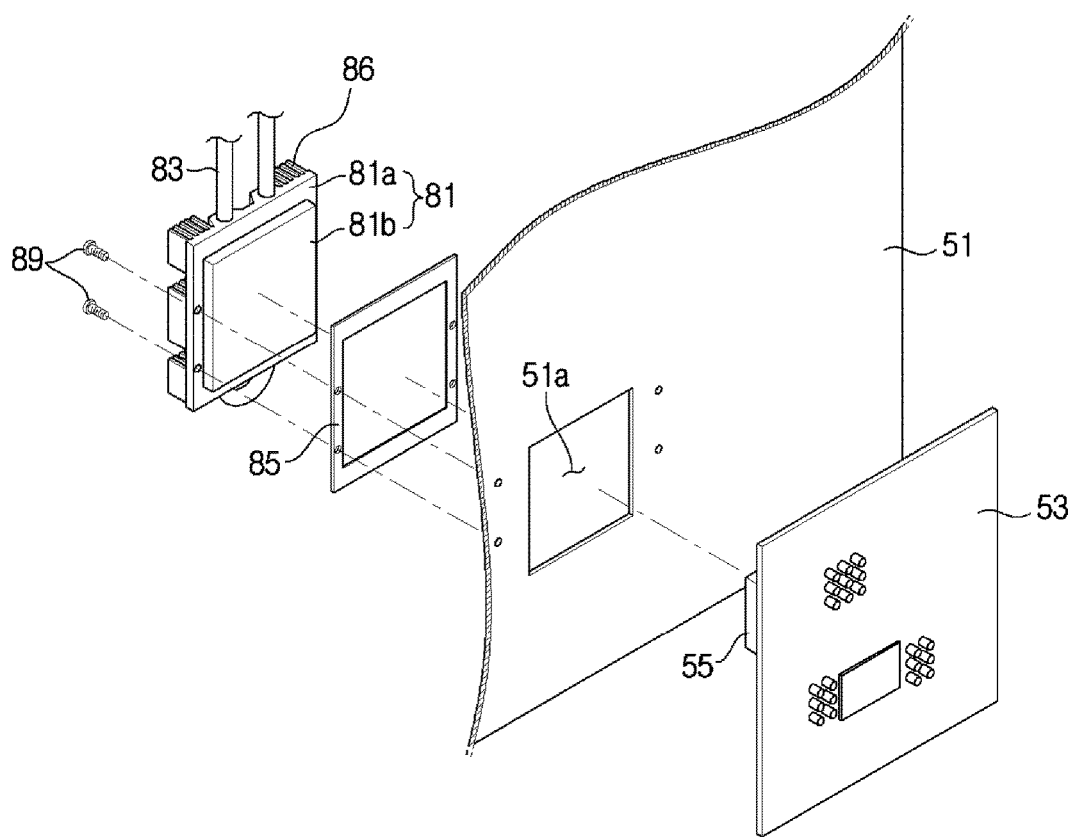
FIG. 5 is an exploded view of the control device with the cooling unit installed thereon as shown in FIG. 4.
Figure 6:
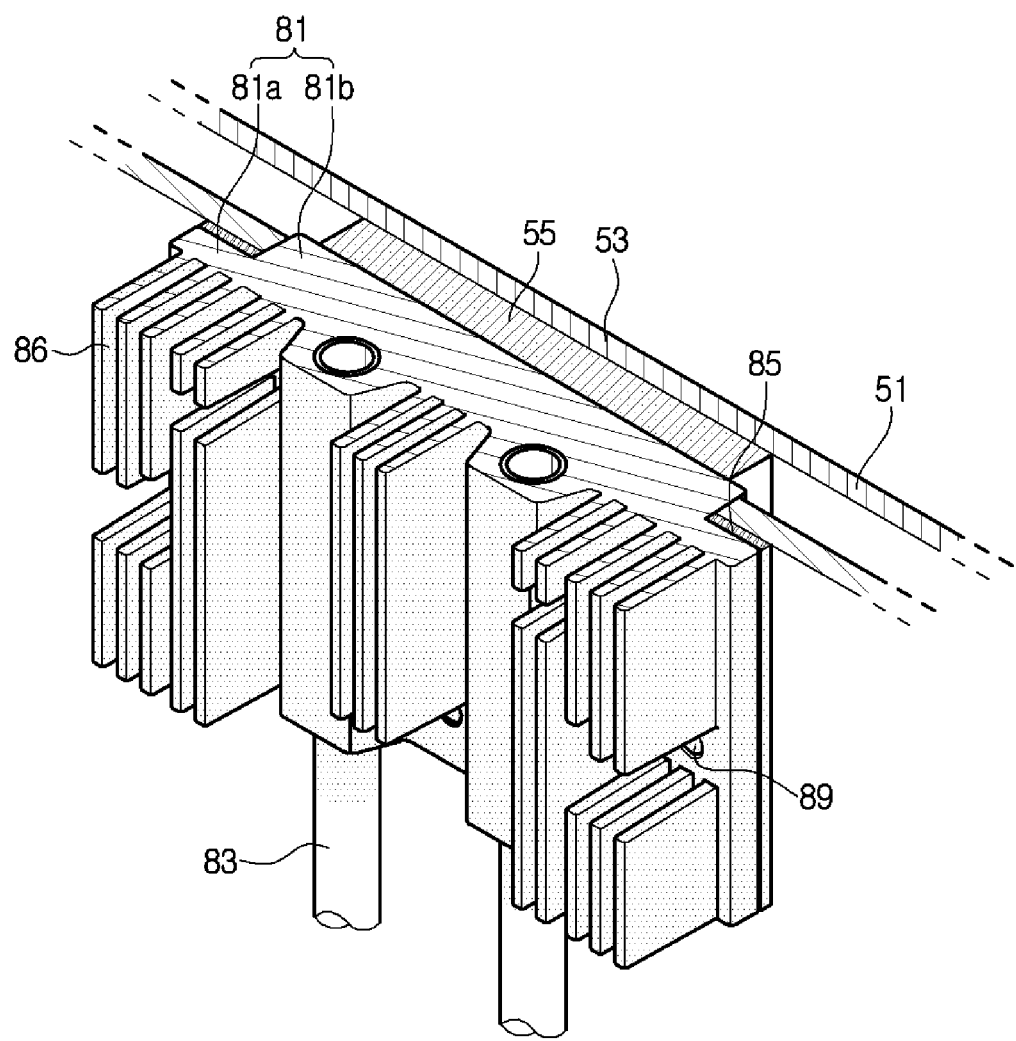
FIG. 6 is a cross-sectional view of a part of the control device with the cooling unit installed thereon as shown in FIG. 4.
Figure 7:
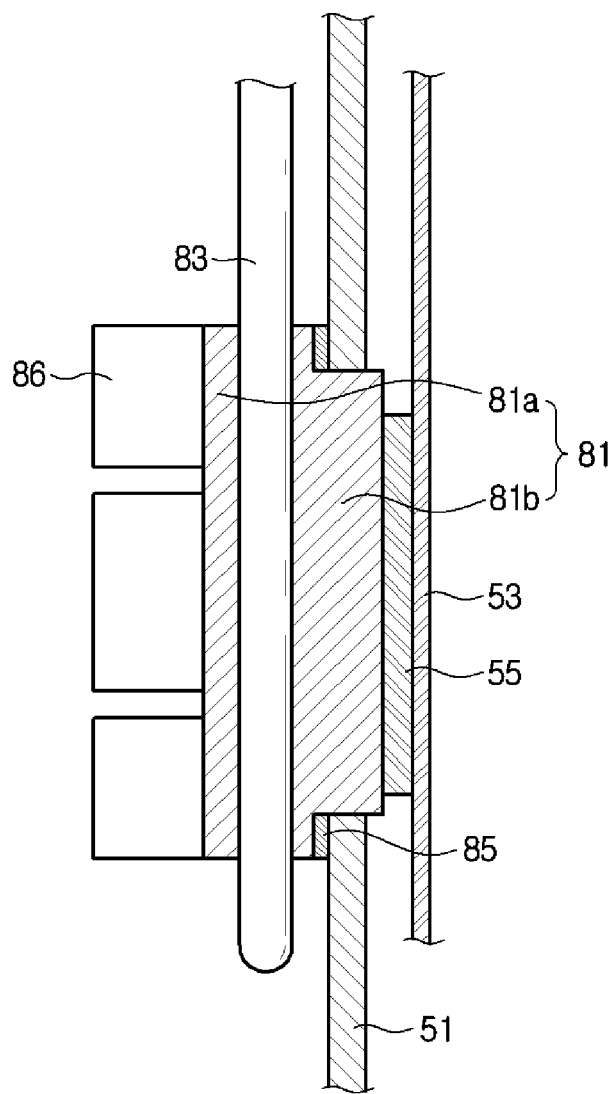
FIG. 7 is a cross-sectional view of the control device of FIG. 4 cut along line A-A'.
Figure 8:
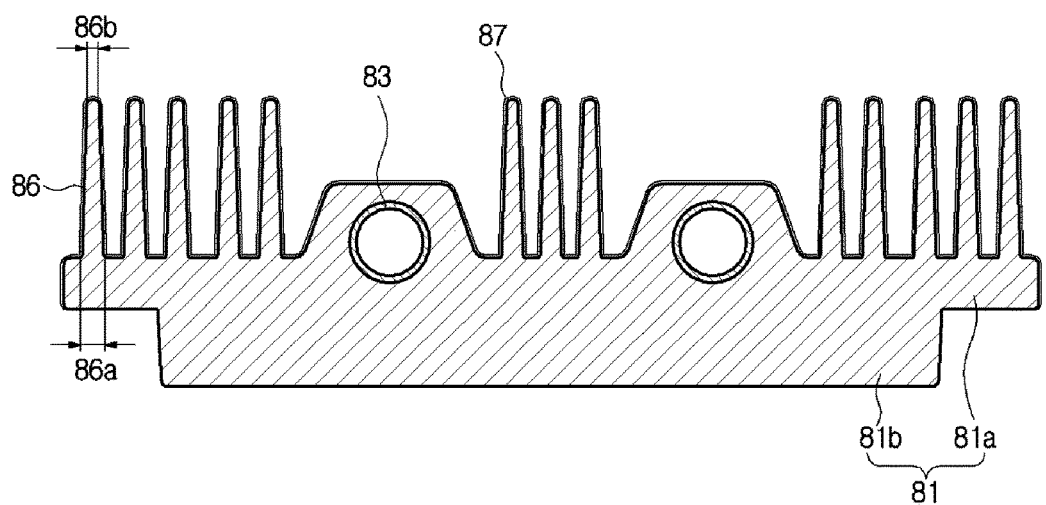
FIG. 8 is a cross-sectional view of the cooling unit of FIG. 4.

FIG. 4 is a perspective view of a control device with a cooling unit installed therein, according to another embodiment of the present disclosure, FIG. 5 is an exploded view of the control device with the cooling unit installed therein as shown in FIG. 4, FIG. 6 is a cross-sectional view of a part of the control device with the cooling unit installed therein as shown in FIG. 4, FIG. 7 is a cross-sectional view of the control device of FIG. 4 cut along line A-A', and FIG. 8 is a cross-sectional view of the cooling unit of FIG. 4.

Referring to FIGS. 1A to 8, the outdoor unit 2 of an air conditioner may further include the cooling unit 80.

The cooling unit 80 may be formed to cool a heat generating part 55 located inside the outdoor unit 2 to keep it at a constant temperature. For example, the cooling unit 80 may cool the heat generating part 55 of the electronic parts 53, which is shown in FIGS. 5-7 and which is located inside the control device 50. Accordingly, the cooling unit 80 may be formed for the control device 50 to maintain a right temperature even while the outdoor unit 2 is working.

The cooling unit 80 may be in direct contact with the heat generating part 55 to exchange heat. Accordingly, while the refrigerant passing through the cooling unit 80 receives heat from the heat generating part 55 and the heat moves outside, the heat generating part 55 may be cooled.

The cooling unit 80 may also be formed to exchange heat with outdoor air flowing into the outdoor unit 2. The cooling unit 80 may be installed on the outer side of the control device 50. As shown in FIG. 2, the cooling unit 80 may be installed in a position on the outer side of the control device 50, which faces a side of the outdoor unit case 3 to which outdoor air flows in. The cooling unit 80 may be bored through the control device 50 to be in contact with the heat generating part 55 of the electronic parts 53. The cooling unit 80 may be installed to be detached from the control device 50. As shown in FIGS. 5 and 6, the cooling unit 80 may be detachably coupled to the case 51 with a bolt 89.

The cooling unit 80 may include a first heat radiation member 81 and a refrigerant pipe 83.

The first heat radiation member 81 may have one side in contact with the heat generating part 55 of the electronic parts 53. The first heat radiation member 81 may be installed on an outer side of the control device 50, and bored through the control device 50 to be in contact with the heat generating part 55 inside the control device 50. The first heat radiation member 81 may be detachably coupled with the control device 50. The first heat radiation member 81 may be installed to be coupled with the control device 50 with a bolt 89. For example, the first heat radiation member 81 may include aluminum.

The first heat radiation member 81 may include a body frame 81a and a contact part 81b. The first heat radiation member 81 may be integrally manufactured to have the body frame 81a and contact part 81b in one unit. A method for manufacturing the first heat radiation member 81 will be described later.

The body frame 81a may be placed on an outer side of the control device 50. The body frame 81a may be detachably combined onto the outer side of the control device 50. The body frame 81a may be provided as being coupled onto the control device 50 with a bolt 89. The body frame 81a may be coupled onto the control device 50 with the bolt 89 in an area where the body frame 81a does not overlap with the contact part 81b.

The body frame 81a may be coupled with the refrigerant pipe 83. The body frame 81a may be in contact with the refrigerant pipe 83 to exchange heat. For example, the body frame 81a may be formed to enclose a part or all of the refrigerant pipe 83.

The contact part 81b may be arranged on one side of the body frame 81a. The contact part 81b may be formed to extend into the control device 50 from the body frame 81a. The contact part 81b may be bored through the case 51 to be in contact with the heat generating part 55 located inside the control device 50.

As shown in FIGS. 5 and 6, the contact part 81b may extend to the inside of the case 51 via a through hole 51a located on one side of the case 51. The contact part 81b may have a section that corresponds to the through hole 51a to be inserted into the through hole 51a. The section of the contact part 81b may be smaller than that of the body frame 81a.

The contact part 81b may be in contact with the heat generating part 55 located inside the control device 50 to exchange heat. The contact part 81b may have a lower temperature than the heat generating part 55 because of the refrigerant pipe 83 in contact with the body frame 81a. Accordingly, the contact part 81b may receive heat from the heat generating part 55, and the heat generating part 55 may thus be cooled.

The refrigerant pipe 83 may be in contact with the first heat radiation member 81 and exchange heat with the first heat radiation member 81. For example, the refrigerant pipe 83 may extend through the inside of the first heat radiation member 81. In this case, an area of the refrigerant pipe 83 being in contact with the first heat radiation member 81 may grow. This may increase the efficiency of heat exchange between the refrigerant pipe 83 and the first heat radiation member 81. The refrigerant pipe 83 may include copper.

The refrigerant may flow through the refrigerant pipe 83. The refrigerant may be provided as a liquid with a lower temperature than the heat generating part 55. The refrigerant may receive heat from the first heat radiation member 81 while flowing through the refrigerant pipe 83. This enables the first heat radiation member 81 that has received heat from the heat generating part 55 to remain at a particular temperature.

As shown in FIG. 1A, the refrigerant pipe 83 may be formed for the liquid refrigerant 75 condensed by the condenser 20 to flow through. The refrigerant 70 under the high temperature and high pressure drops to a low temperature while being condensed by the condenser 20. The low temperature liquid refrigerant 75 that has passed the condenser 20 may flow to the cooling unit 80. The cooling unit 80 may cool the heat generating part 55 by using the low temperature liquid refrigerant 75.

Furthermore, as shown in FIG. 1B, the refrigerant pipe 83 may be formed for the refrigerant 77 under the low temperature and low pressure expanded by the expansion valve 30 to flow through. The low temperature and low pressure refrigerant 77 that has passed the expansion valve 30 may flow to the cooling unit 80. The cooling unit 80 may cool the heat generating part 55 by using the low temperature and low pressure refrigerant 77.

A sealing member 85 may be arranged between the body frame 81*a* and the case 51. The sealing member 85 may prevent rainwater or foreign materials from moving between the body frame 81*a* and the case 51 by sealing the body frame 81*a* and the case 51.

The cooling unit 80 may further include a second heat radiation member 86. The second heat radiation member 86 may be formed on one side of the first heat radiation member 81. The second heat radiation member 86 may be installed to be coupled with the first heat radiation member 81 for heat transfer and to come in contact with outdoor air flowing into the control device 50. The second heat radiation member 86 may be formed of a material with high thermal conductivity. For example, the second heat radiation member 86 may include aluminum.

The second heat radiation member 86 may be formed on any of the outer sides of the body frame 81*a* except for the side where the contact part 81*b* is formed. The cooling unit 80 may be formed such that the contact part 81*b* is formed on one side of the body frame 81*a* and the second heat radiation member 86 is formed on the other side of the body frame 81*a*. The second heat radiation member 86 may have a form that extends from one side of the first heat radiation member 81 to the outer side of the case 51. The second heat radiation members 86 may be provided in multiple pieces.

For example, as shown in FIG. 8, the second heat radiation member 86 may have a form that is tapered as it becomes distant from the first heat radiation member 81. That is, a part of the second heat radiation member 86, which is close to the first heat radiation member 81, may be thicker than a part that is distant from the first heat radiation member 81. Alternatively, the second heat radiation member 86 may have constant thickness throughout its length.

As shown in FIG. 2, the second heat radiation member 86 may be arranged to face one side of the outdoor unit case 3, to which outdoor air flows in. The second heat radiation member 86 may be formed of a material having a superior thermal conductivity, and formed as multiple pieces to increase a contact area between the outdoor air flowing in from the outside of the outdoor unit 2 and the cooling unit 80. This may enable the cooling unit 80 to release heat by coming in contact with the air flowing into the inside of the outdoor unit 2.

The cooling unit 80 may be provided as being coated. A coating layer 87 may be formed on the outer side of the main body 81*a*. The coating layer 87 may commonly include an epoxy material. The coating layer 87 applied on the body frame 81*a* located on the outer side of the case 51 may prevent corrosion. As shown in FIGS. 4 and 6, the cooling unit 80 may be provided with the body frame 81*a*, the second heat radiation member 86, and part of the refrigerant pipe 83 located adjacent to the cooling unit 80, which are in the coated state (as in the shading parts shown in FIGS. 4 and 6).

The cooling units 80 may be provided in multiple pieces. The multiple cooling units 80 may depend on types, the number, and locations of heating units located in the outdoor unit 2.

With the aforementioned features, the cooling unit 80 may cool the heat generating part 55 by heat exchange with the refrigerant flowing through the refrigerant pipe 83, and may further cool the heat generating part 55 by heat exchange with the air flowing into the outdoor unit 2.

Especially, if the outdoor unit 2 is put under high temperatures of 40° C. or more, internal temperature of the outdoor unit 2 may rise higher than the external temperature due to the heat produced inside the outdoor unit 2. Under this high temperature, the pressure of the refrigerant circulating in the outdoor unit 2 may grow higher. The refrigerant needs to remain under less than a certain pressure inside the air conditioner, so if the pressure grows higher due to the external temperature, circulation cycles of the refrigerant may slow down by less often driving the compressor that circulates refrigerant in order to maintain the certain pressure. This may allow the refrigerant to remain under less than certain pressure inside the air conditioner, however leading to degradation of cooling efficiency of the cooling unit 80 by using the refrigerant.

On the contrary, in an embodiment of the present disclosure, the cooling unit 80 is cooled not only by using the refrigerant but also by using the air flowing into the outdoor unit 2, thereby improving the cooling efficiency even under high temperature conditions. Even if the outdoor air has high temperature, heat exchange to a certain extent may still take place by increasing an amount of air to flow into the outdoor unit 2. This may enable the cooling unit 80 to operate such that the control device 50 maintains a certain temperature even in the case that circulation of a refrigerant slows down due to high temperature.

Figure 9:
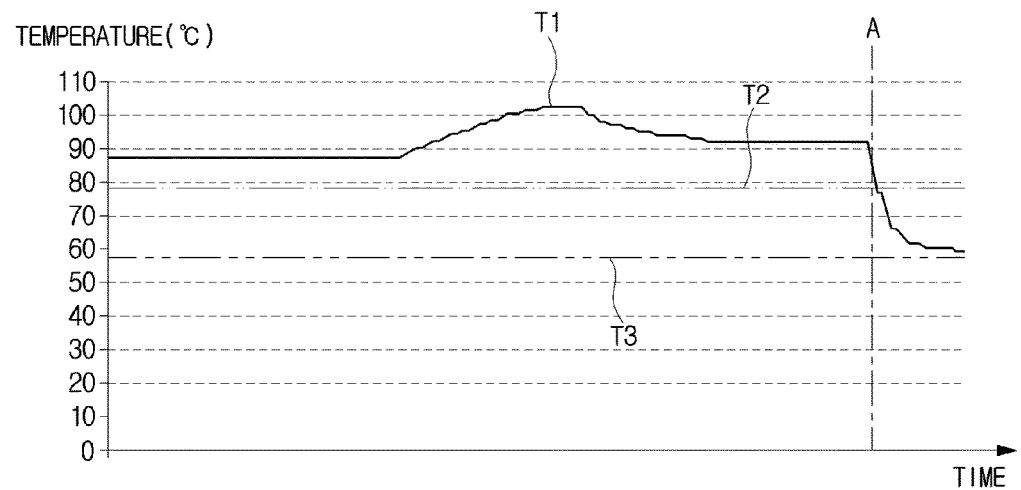
FIG. 9 shows experimental results of temperatures of a control device while an air conditioner is operating, according to an embodiment of the present disclosure.

FIG. 9 shows experimental results of temperatures of a control device while an air conditioner is operating, according to an embodiment of the present disclosure.

In the graph of FIG. 9, the horizontal axis denotes time, and the vertical axis denotes temperatures inside the control device 50 over time.

The experimental results of FIG. 9 are obtained by measuring temperatures over time inside the control device 50 while the outdoor unit is operating at an outdoor temperature of about 58° C.

T1 represents temperatures inside a conventional control device with a cooling unit installed thereon, the cooling unit being cooled only by using a refrigerant; T2 represents temperatures inside the control device 50 with the cooling unit 80 installed thereon, the cooling unit being cooled by using a refrigerant and the outdoor air flowing in thereto; T3 represents temperatures inside the control device 50 while the outdoor unit is not working.

Referring to the experimental results of FIG. 9, it is seen that the temperature T1 inside the control device with the cooling unit installed thereon and cooled only by using the refrigerant rises after the lapse of a certain time, and that the temperature T1 drops by controlling operation of the outdoor unit when the temperature rises. Despite this, however, the temperature remains at about 90° C. or higher, and after a certain point of time A, the outdoor unit is forcibly stopped for protection.

Unlike this, in an embodiment of the present disclosure, the control device 50 with the cooling unit 80 installed thereon may keep its internal temperature T2 at about 80° C. or lower. According to the experimental results, the outdoor unit 2 may operate while maintaining the internal temperature T2 to be about 77° C. This may enable the outdoor unit 2 to keep on operating even under a high outdoor temperature of about 58° C.

As such, in accordance with an embodiment of the present disclosure, the cooling unit 80 may keep the internal temperature of the control device 50 at a certain level such that the outdoor unit 2 may keep on operating even under high outdoor temperatures.

A method for manufacturing the cooling unit 80 will now be described in detail.

Figure 10:
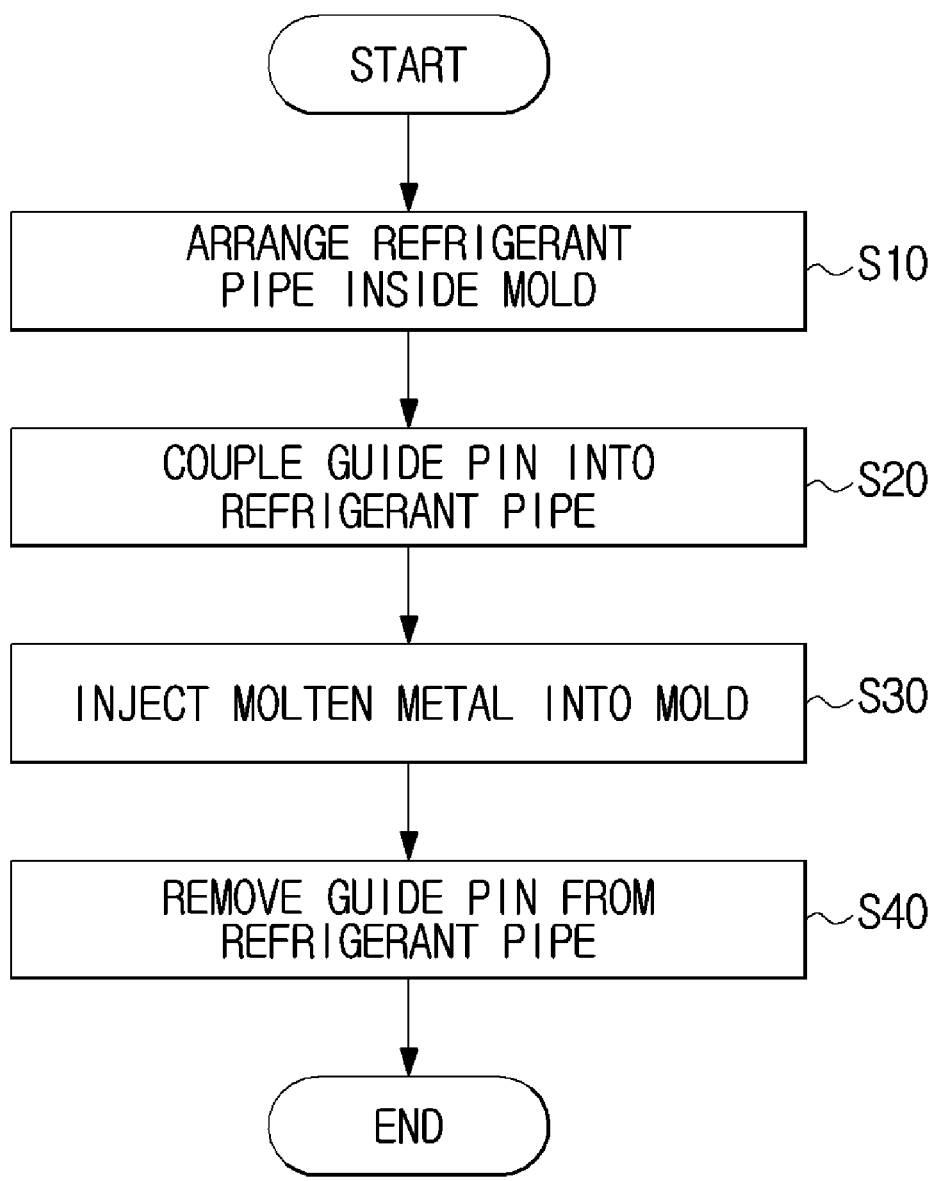
FIG. 10 is a flowchart illustrating a method for manufacturing a cooling unit, according to an embodiment of the present disclosure.

FIG. 10 is a flowchart schematically illustrating a method for manufacturing a cooling unit, according to an embodiment of the present disclosure.

Referring to FIG. 10, a method for manufacturing a cooling unit may include arranging a refrigerant pipe in a mold, in step S10, coupling a guide pin into the refrigerant pipe, in step S20, injecting a molten metal into the mold, in step S30, and removing the guide pin out of the refrigerant pipe, in step S40.

Figure 14:
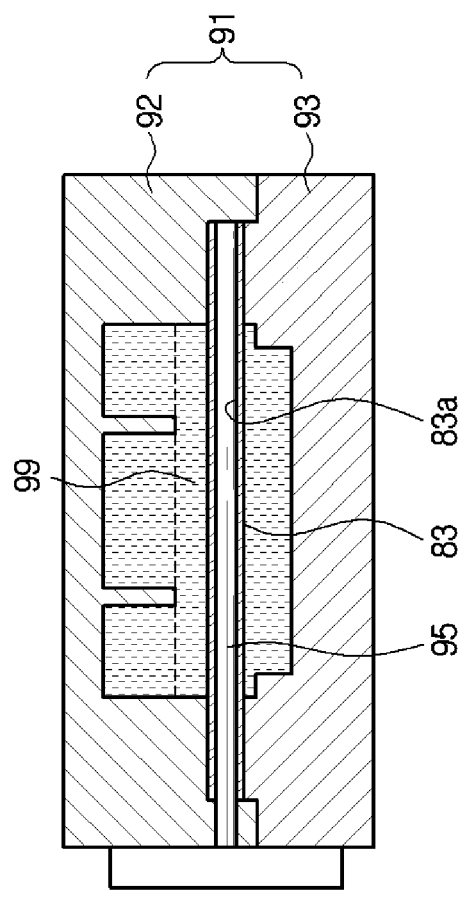

The cooling unit 80 in accordance with an embodiment of the present disclosure may be formed by inserting a part or all of the refrigerant pipe 83 into the first heat radiation member 81. The cooling unit 80 may be manufactured in a die casting method including arranging the refrigerant pipe 83 in a mold 91 as shown in FIG. 11 and injecting a molten metal 99 as shown in FIG. 14 into a casting space 94 as shown in FIG. 12 in the mold 91.

FIGS. 11 to 16 show a procedure of manufacturing a cooling unit, according to an embodiment of the present disclosure.

Figure 11:
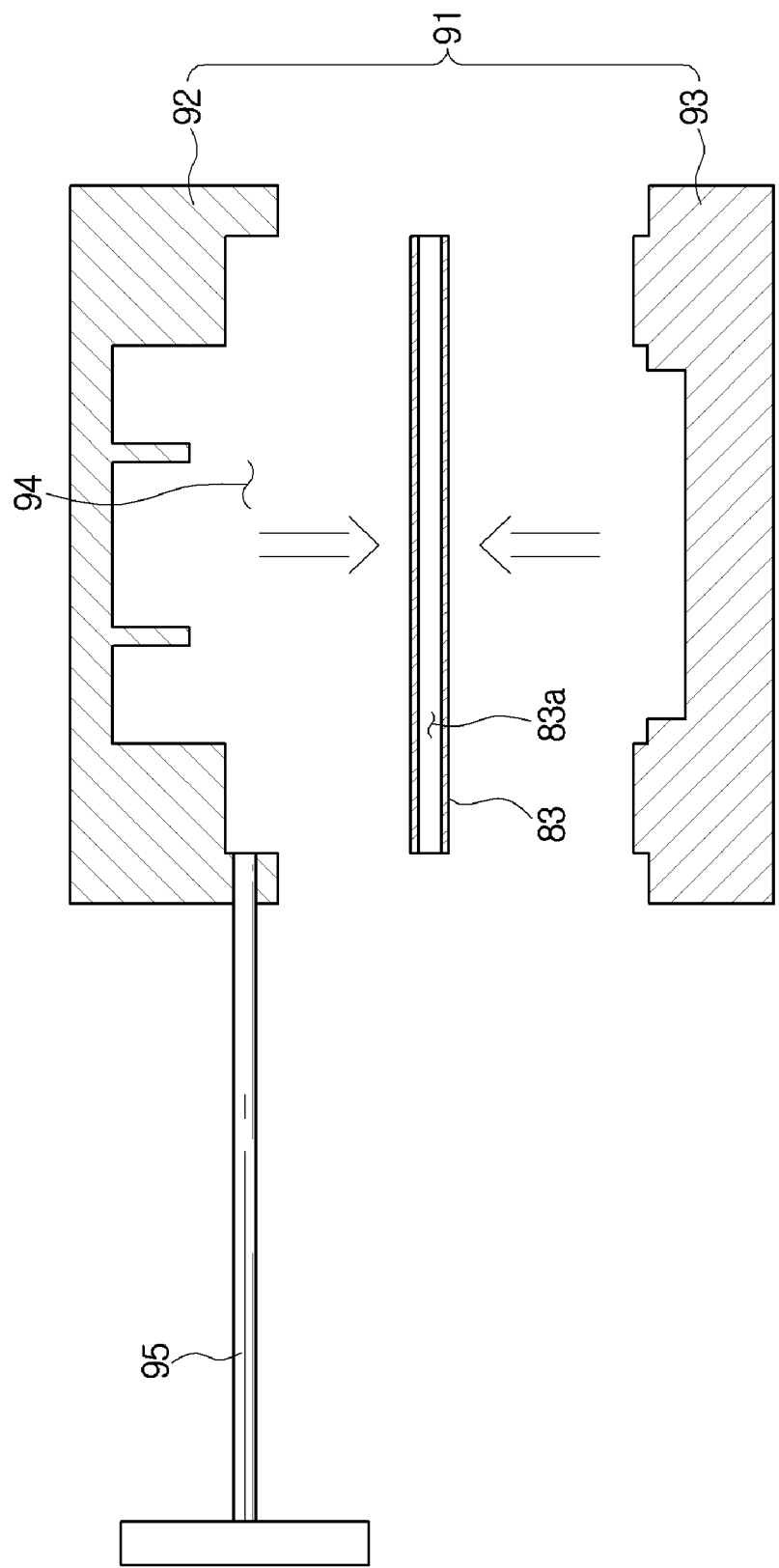
FIGS. 11 to 16 show a procedure of manufacturing a cooling unit, according to an embodiment of the present disclosure.
Figure 12:
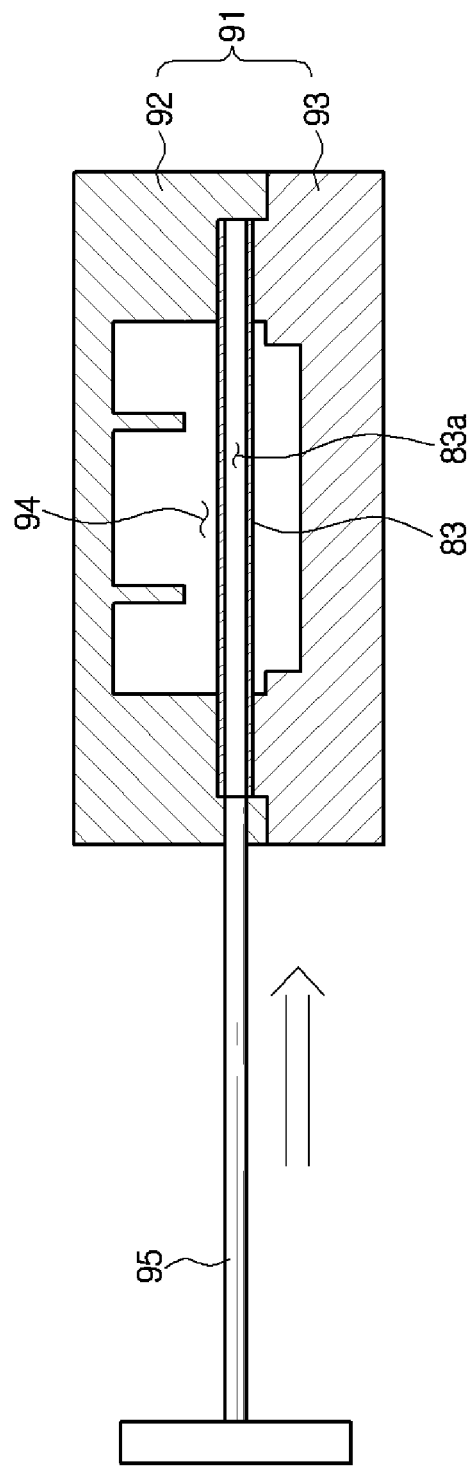

As shown in FIGS. 11 and 12, the refrigerant pipe 83 may be arranged in the mold 91, in step S10. The mold 91 may include an upper mold 92 and a lower mold 93. The upper mold 92 and lower mold 93 are combined together to form the casting space 94 inside the mold 91. The upper mold 92 and the lower mold 93 may be separated as shown in FIG. 11, or may be combined to form the casting space 94 as shown in FIG. 12.

At least a part of the refrigerant pipe 83 may be located in the casting space 94 formed inside the mold 91. By arranging the refrigerant pipe 83 in the casting space 94 formed inside the mold 91, the molten metal 99 of FIG. 14 may be injected into the casting space 94 in the form of surrounding the at least a part of the refrigerant pipe 83.

Figure 13:
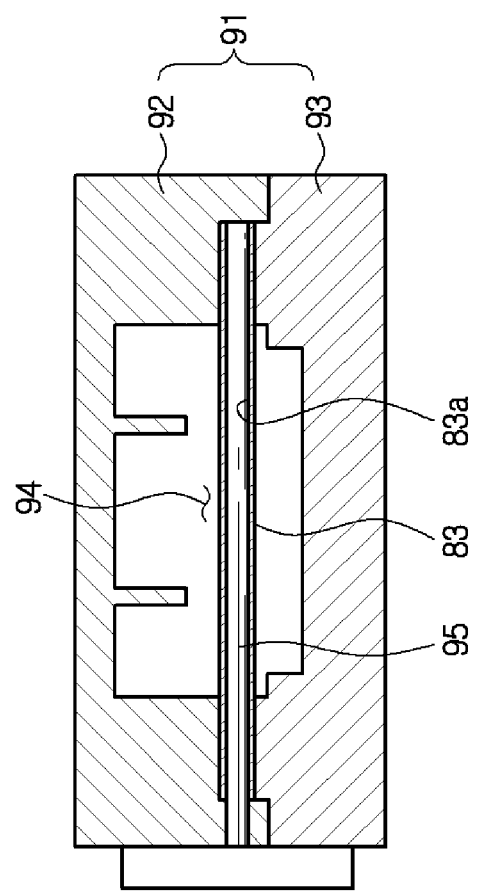

As shown in FIGS. 12 and 13, the guide pin 95 may be coupled into the refrigerant pipe 83, in step S20. Specifically, the guide pin 95 may be coupled into the refrigerant pipe 83 before the molten metal 99 is injected into the casting space 94. For example, the guide pin 95 may be inserted into an internal fluid path 83*a* formed inside the refrigerant pipe 83. This may prevent deformation and damage to the refrigerant pipe 83 owing to the high temperature molten metal 99 injected into the casting space 94.

The guide pin 95 may be formed of a metal substance. Specifically, the guide pin 95 may be formed of a metal having a higher melting point than the refrigerant pipe 83 formed of copper Cu.

The guide pin 95 may be formed to be inserted into the internal fluid path 83*a* of the refrigerant pipe 83. The guide pin 95 may be formed to have the same section as that of the internal fluid path 83*a* of the refrigerant pipe 83. With the features, the guide pin 95 may be inserted into the internal fluid path 83*a* of the refrigerant pipe 83 to serve to prevent deformation to the refrigerant pipe 83.

As shown in FIG. 14, once the guide pin 95 is coupled into the refrigerant pipe 83, the molten metal may be injected into the mold, in step S30. The molten metal 99 may be injected into the casting space 94 formed in the mold 91.

The molten metal 99 to be injected into the casting space 94 may have temperatures of about 600° C. to about 700° C. The molten metal 99 may be formed of aluminum. The refrigerant 83 having copper may be deformed or damaged due to the temperature and pressure of the molten metal 99 injected into the casting space 94 at temperatures about 600° C. to 700° C.

Accordingly, in the method of manufacturing the cooling unit in an embodiment of the present disclosure, the guide pin 95 may be inserted into the refrigerant pipe 83 to prevent deformation or damage to the refrigerant pipe 83 even when a high temperature molten metal is injected.

Figure 15:
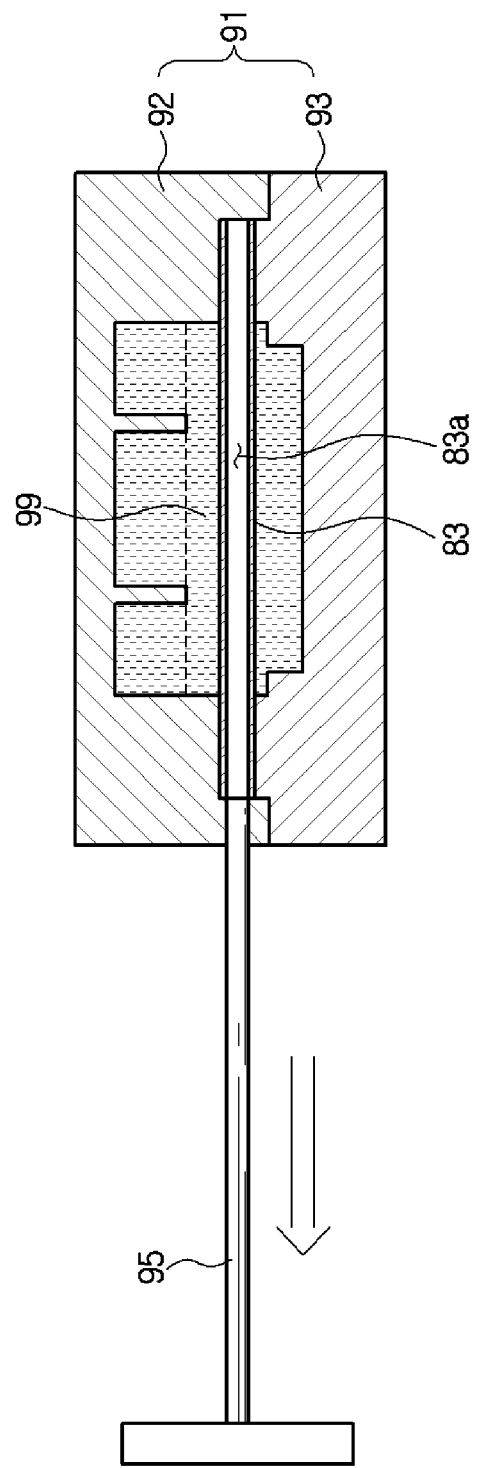

As shown in FIG. 15, once the molten metal is injected into the mold, the guide pin may be removed out of the refrigerant pipe, in step S40. That is, once all the molten metal 99 has been injected into the casting space 94, the guide pin 95 may be removed from the refrigerant pipe 83. While the refrigerant pipe 83 preserves itself from deformation or damage due to the molten metal 99 injected into the casting space 94, the guide pin 95 may be removed from the refrigerant pipe 83.

Figure 16:
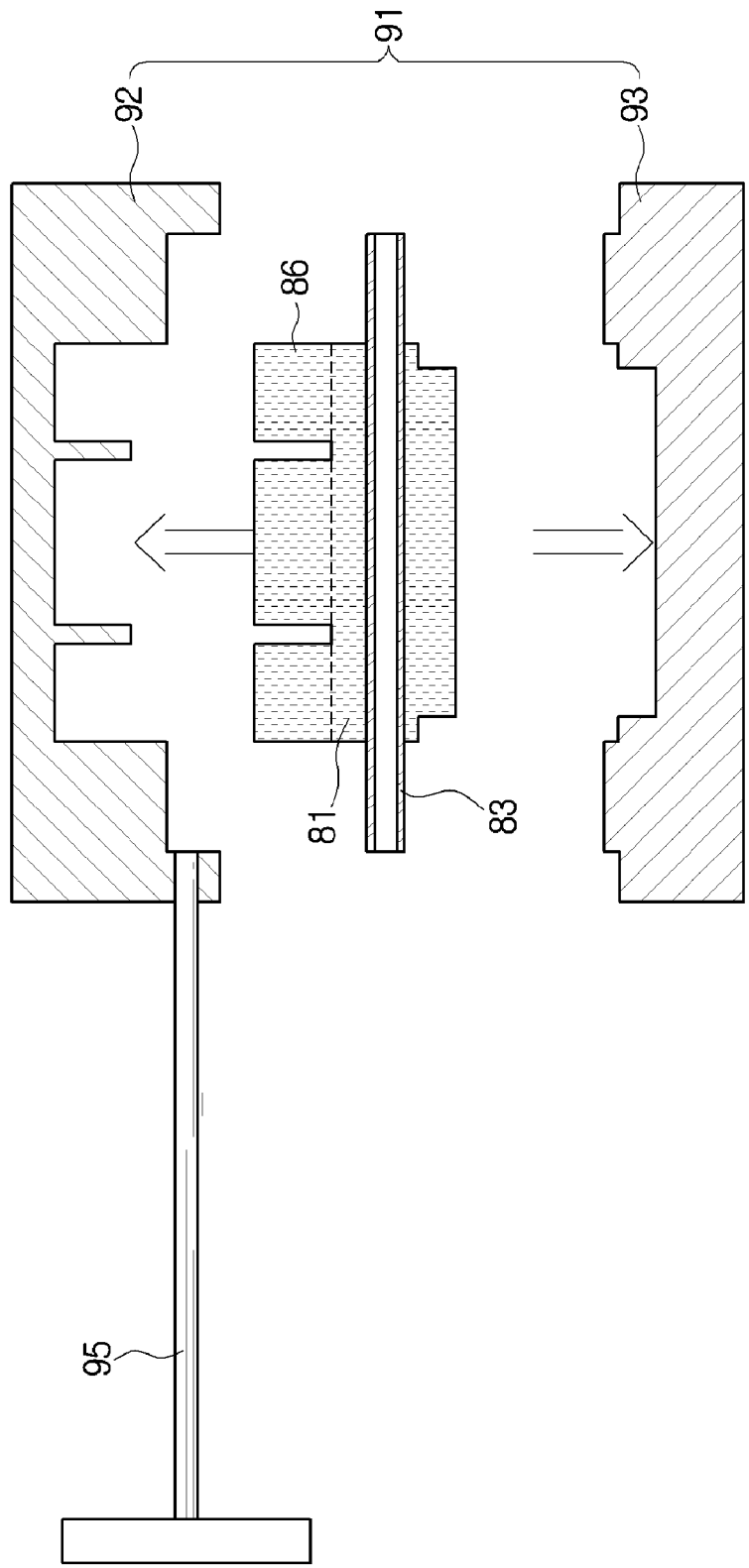

As shown in FIG. 16, once the guide pin 95 has been removed from the refrigerant pipe 83, the manufactured cooling unit 60 may be separated from the mold 91. The cooling unit 60 may be manufactured in a form that the refrigerant pipe 83 is inserted into the first heat radiation member 81 formed by solidifying the molten metal 99. With this method, the cooling unit 80 in accordance with an embodiment of the present disclosure may be manufactured.

In a case of coupling the refrigerant pipe 83 to the first heat radiation member 81 by e.g., press fitting, a minute space may often be created between the first heat radiation member 81 and the refrigerant pipe 83. As such, if the first heat radiation member 81 and the refrigerant pipe 83 have incomplete contact with each other, the efficiency of heat exchange between the first heat radiation member 81 and the refrigerant pipe 83 may be degraded.

However, in the die casting method of forming the first heat radiation member 81 by injecting the molten metal 95 while the refrigerant pipe 83 is located inside the mold 91, the cooling unit 80 may have an increased contact area between the first heat radiation member 81 and the refrigerant pipe 83. This may improve the efficiency of heat exchange between the refrigerant flowing through the refrigerant pipe 83 and the first heat radiation member 81. It may also improve the cooling efficiency of the cooling unit 80.

According to embodiments of the present disclosure, the heat generating part may be efficiently cooled by improving the efficiency of heat exchange.

The efficiency of heat exchange between an heat radiation member for cooling the heat generating part and a refrigerant pipe may increase by increasing a contact area between the heat radiation member and the refrigerant pipe. This may lead to improvement of the cooling efficiency of the cooling unit.

Since refrigerant-based cooling and air-based cooling are simultaneously performed, the cooling efficiency of the cooling unit may be maintained constant even under a high temperature environment.

Furthermore, a manufacturing process of the cooling unit may be simplified, thereby saving the manufacturing cost.

In addition, damage to the refrigerant pipe inserted into the heat radiation member in the manufacturing process of the cooling unit may be prevented.

Several embodiments have been described, but a person of ordinary skill in the art will understand and appreciate that various modifications can be made without departing the scope of the present disclosure. Thus, it will be apparent to those ordinary skilled in the art that the disclosure is not limited to embodiments described, which have been provided only for illustrative purposes.

What is claimed is:

1. An outdoor unit of an air conditioner comprising:
   a compressor to compress a refrigerant;
   a condenser to condense the refrigerant discharged from the compressor;
   a control device including:
      a case, and
      an electronic part within the case to control the outdoor unit; and
   a cooling unit comprising:
      a first heat radiation member installed to be in contact with the electronic part,
      a refrigerant pipe which extends through the first heat radiation member and which enables the refrigerant to flow through the refrigerant pipe, and
      a second heat radiation member coupled with the first heat radiation member to transfer heat from the first heat radiation member, and in contact with air outside the case, thereby to cool the electronic part.

2. The outdoor unit of claim 1, wherein:
   the first heat radiation member comprises:
      a body frame arranged on an outer side of the case and coupled with the case, and
      a contact part arranged on a side of the body frame and bored through the case to be in contact with the electronic part.

3. The outdoor unit of claim 2, wherein:
   the body frame has a plurality of sides, and
   the second heat radiation member is formed on one of the plurality the sides of the body frame except for a side of the body frame on which the contact part is formed.

4. The outdoor unit of claim 2, wherein the refrigerant pipe extends through the body frame.

5. The outdoor unit of claim 2, wherein the body frame, the refrigerant pipe, and the second heat radiation member are coated.

6. The outdoor unit of claim 1, wherein the refrigerant pipe enables the refrigerant flowing out of the condenser to flow through the inside of the refrigerant pipe.

7. The outdoor unit of claim 1, wherein the first heat radiation member includes aluminum or the second heat radiation member includes aluminum.

8. The outdoor unit of claim 1, further comprising:
   an expansion valve to expand the refrigerant condensed by the condenser,
   wherein the refrigerant pipe enables the refrigerant flowing out of the expansion valve to flow through the inside of the refrigerant pipe.

9. The outdoor unit of claim 1, wherein the first heat radiation member is manufactured in a die casting process of injecting a molten metal into a mold with the refrigerant pipe located inside the mold.

10. A control device comprising:
    a case;
    an electronic part arranged inside the case to control an outdoor unit of an air conditioner; and
    a cooling unit comprising:
       a first heat radiation member installed to be in contact with the electronic part,
       a refrigerant pipe which extends through the first heat radiation member and which enables a refrigerant to flow through the refrigerant pipe, and
       a second heat radiation member which extends from one side of the first heat radiation member to an outer side of the case to be in contact with air outside the case.

11. The control device of claim 10, wherein:
    the first heat radiation member comprises:
       a body frame arranged on an outer side of the case and coupled with the case; and
       a contact part arranged on one side of the body frame and bored through the case to be in contact with the electronic part, and
    the second heat radiation member is arranged on another side of the body frame.

12. The control device of claim 11, wherein the refrigerant pipe has an area surrounded by the body frame.

13. The control device of claim 11, wherein the body frame, the refrigerant pipe, and the second heat radiation member are coated.

14. The control device of claim 10, wherein the refrigerant pipe enables the refrigerant flowing out of a condenser included in the air conditioner to flow through the inside of the refrigerant pipe.

15. The control device of claim 10, wherein the refrigerant pipe enables the refrigerant flowing out of an expansion valve included in the air conditioner to flow through the inside of the refrigerant pipe.

16. The control device of claim 10, wherein the first heat radiation member includes aluminum or second heat radiation member includes aluminum.

17. The control device of claim 10, wherein the first heat radiation member is manufactured in a die casting process of injecting a molten metal into a mold with the refrigerant pipe located inside the mold.

18. A control device configured to be installed in an outdoor unit of an air conditioner, the control device comprising:
    an electronic part mounted to an inner wall of a case and configured to control the outdoor unit of the air conditioner;
    a cooling unit detachably mounted to an outer side of the case and bored through the case to contact with the electronic part, the cooling unit comprising:
       a first heat radiation member installed to be in contact with the electronic part,
       a refrigerant pipe which extends through the first heat radiation member which is configured to receive a refrigerant, and
       a second heat radiation member which extends from one side of the first heat radiation member to the outer side of the case, so that the cooling unit cools the electronic part while the electronic part is operating.

19. The control device of claim 18, wherein the refrigerant is a high pressure liquid refrigerant, which is received from a condenser of the outdoor unit.

20. The control device of claim 18, wherein the refrigerant is a low pressure liquid refrigerant, which is received from an expansion valve of the outdoor unit.

* * * * *